(12) United States Patent
Kang et al.

(10) Patent No.: US 11,840,764 B2
(45) Date of Patent: Dec. 12, 2023

(54) LAMINATE AND METHOD FOR PREPARING THE SAME

(71) Applicant: HYUNDAI MOBIS CO., LTD., Seoul (KR)

(72) Inventors: Hyoung Taek Kang, Yongin-si (KR);
Hyeon Don Kim, Yongin-si (KR);
Keun Hyung Lee, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 0 days.

(21) Appl. No.: 17/569,827

(22) Filed: Jan. 6, 2022

(65) Prior Publication Data

US 2022/0213602 A1 Jul. 7, 2022

(30) Foreign Application Priority Data

Jan. 7, 2021 (KR) .......................... 10-2021-0002169

(51) Int. Cl.
| | | |
|---|---|---|
| *C23C 28/04* | (2006.01) | |
| *C09D 1/04* | (2006.01) | |
| *C03C 17/34* | (2006.01) | |
| *C23C 28/00* | (2006.01) | |
| *B32B 17/06* | (2006.01) | |

(Continued)

(52) U.S. Cl.
CPC .............. *C23C 28/42* (2013.01); *B32B 17/06* (2013.01); *C09D 1/04* (2013.01); *C23C 14/34* (2013.01); *C23C 14/5833* (2013.01); *C23C 28/042* (2013.01); *C23C 28/048* (2013.01)

(58) Field of Classification Search
None
See application file for complete search history.

(56) References Cited

U.S. PATENT DOCUMENTS

| | | | |
|---|---|---|---|
| 6,783,704 B1 | 8/2004 | Anthes et al. | |
| 2019/0346590 A1* | 11/2019 | Huang | G02B 1/115 |

(Continued)

FOREIGN PATENT DOCUMENTS

| | | |
|---|---|---|
| CA | 2285612 A1 | 4/1999 |
| CN | 1809654 A | 7/2006 |
| CN | 101925837 A | 12/2010 |

(Continued)

OTHER PUBLICATIONS

Office Action dated Jul. 2, 2022 in the corresponding German Patent Application No. 102022200078.1.

(Continued)

*Primary Examiner* — David Sample
(74) *Attorney, Agent, or Firm* — NovoTechIP International PLLC

(57) ABSTRACT

The present disclosure relates to a laminate and a method for preparing the same. The laminate comprises a substrate, a coating layer, and a water-repellent layer sequentially laminated, the coating layer comprises a first coating layer and a second coating layer laminated one or more times alternately, the first coating layer comprises at least one metal oxide selected from a group consisting of a lanthanide metal oxide, a transition metal oxide, and a composite metal oxide comprising lanthanum metal and transition metal, the second coating layer comprises an alkaline earth metal fluoride and a transition metal oxide.

14 Claims, 4 Drawing Sheets

(51) Int. Cl.
*C23C 14/58* (2006.01)
*C23C 14/34* (2006.01)

(56) References Cited

U.S. PATENT DOCUMENTS

2020/0346973 A1* 11/2020 Akao ...................... C03C 3/066
2021/0199854 A1*  7/2021 Nakano ................. C01G 35/00

FOREIGN PATENT DOCUMENTS

| | | |
|---|---|---|
| CN | 106019425 A | 10/2016 |
| CN | 107298885 A | 10/2017 |
| CN | 108779551 A | 11/2018 |
| CN | 110537116 A | 12/2019 |
| CN | 111683910 A | 9/2020 |
| DE | 102014013527 A1 | 3/2016 |
| KR | 10-0902382 B1 | 6/2009 |
| WO | WO-2018193742 A1 * | 10/2018 ............... B05D 1/60 |

OTHER PUBLICATIONS

Office Action dated Dec. 9, 2022 in corresponding Chinese patent application No. 202210019268.4.
Office Action dated May 31, 2023 in corresponding Chinese patent application No. 202210019268.4.

* cited by examiner

FIG. 4

| DIVISION | 0.5 WT% AQUEOUS SOLUTION OF AMMONIUM FLUORIDE ACID | | 2.0 WT% AQUEOUS SOLUTION OF AMMONIUM FLUORIDE ACID | |
|---|---|---|---|---|
| | EXAMPLE 1 | COMPARATIVE EXAMPLE 2 | EXAMPLE 1 | COMPARATIVE EXAMPLE 2 |
| WHETHER THERE IS DAMAGE | NO DAMAGE | DAMAGE OCCURRED | NO DAMAGE | DAMAGE OCCURRED |
| MICRO-SCOPIC PHOTO-GRAPH | | | | |

LAMINATE AND METHOD FOR PREPARING THE SAME

CROSS-REFERENCE TO RELATED APPLICATIONS

This application claims the benefit of priority to Korean Patent Application No. 10-2021-0002169, filed in the Korean Intellectual Property Office on Jan. 7, 2021, the entire contents of which are incorporated herein by reference.

BACKGROUND

1. Technical Field

The present disclosure relates to a laminate and a method for preparing the same, and more particularly, to a laminate and a method for preparing the same including a coating layer and a water-repellent layer for protecting a surface of a cover glass of an optical lens.

2. Discussion of Related Art

Recently, a vehicle industry is developing day by day, and accordingly, demands for various convenience specifications as well as a vehicle drive system are increasing. In particular, in relation to the convenience specifications, a rear camera that may directly identify a rear surface of a vehicle with an image display device when going backward has been introduced. Recently, as an around view that may identify all surroundings of the vehicle has been introduced, even front and side cameras that may directly identify a front surface and a side surface of the vehicle with the image display device have been introduced.

The cameras are exposed to the outside of the vehicle, so that there is a high possibility of scratches on surfaces thereof depending on a travel environment of the vehicle, which is a cause of image recognition deterioration of the camera. As a solution to such problem, a method for introducing a cover glass coated with a coating layer on an outermost surface of a camera lens has been proposed.

However, when chemical resistance of the coating layer of the cover glass is not sufficient, there is a problem in that the coating layer is eroded by a cleaning agent, especially acid ammonium fluoride, used when washing the vehicle. Such erosion of the coating layer soon causes bubbles in the coating layer, which causes the image recognition deterioration of the camera, causes impurities to penetrate an interfacial gap of the coating layer, and increases the possibility of the scratches by directly exposing the cover glass to the outside.

In one example, because the cameras are exposed to the outside of the vehicle, droplets may be formed on the surfaces thereof depending on a surrounding environment of the vehicle. This is a cause of the image recognition deterioration of the camera, so that water repellency is also required.

In addition, the coating layer of the cover glass is also required to have low reflectivity to prevent the image recognition deterioration resulted from light reflection by light introduced into the camera lens of the camera.

SUMMARY

The present disclosure has been made to solve the above-mentioned problems occurring in the prior art while advantages achieved by the prior art are maintained intact.

An aspect of the present disclosure simultaneously imparts chemical resistance, water repellency, and low reflectivity to a cover glass of an optical lens.

Another aspect of the present disclosure provides a laminate and a method for preparing the same including a coating layer for simultaneously imparting chemical resistance and low reflectivity to a cover glass of an optical lens, and a water-repellent layer for securing water repellency.

The technical problems to be solved by the present disclosure are not limited to the aforementioned problems, and any other technical problems not mentioned herein will be clearly understood from the following description by those skilled in the art to which the present disclosure pertains.

According to an aspect of the present disclosure, a laminate includes a substrate, a coating layer, and a water-repellent layer sequentially laminated, a first coating layer and a second coating layer are alternately laminated one or more times in the coating layer, the first coating layer contains at least one metal oxide selected from a group consisting of a lanthanide metal oxide, a transition metal oxide, and a composite metal oxide containing lanthanum metal and transition metal, and the second coating layer contains an alkaline earth metal fluoride and the transition metal oxide.

According to an aspect of the present disclosure, a method for preparing a laminate includes an operation (S10) of preparing a substrate, an operation (S20) of laminating a coating layer on one surface of the substrate, and an operation (S30) of laminating a water-repellent layer on a surface of the coating layer, the operation (S20) includes an operation of alternately laminating a first coating layer and a second coating layer one or more times, the first coating layer contains at least one selected from a group consisting of a lanthanide metal oxide, a transition metal oxide, and a composite metal oxide containing lanthanide metal and transition metal, and the second coating layer contains an alkaline earth metal fluoride and the transition metal oxide.

BRIEF DESCRIPTION OF THE DRAWINGS

The above and other objects, features and advantages of the present disclosure will be more apparent from the following detailed description taken in conjunction with the accompanying drawings:

FIG. 4 is a table showing whether there is a damage resulted from exposure to an acid ammonium fluoride aqueous solution and microscopic photographs of laminates of Example 1 and Comparative Example 2 of the present disclosure; and FIG. 5 is a photograph obtained by measuring a contact angle for a laminate of Example 1 of the present disclosure.

DETAILED DESCRIPTION

Figure 1:
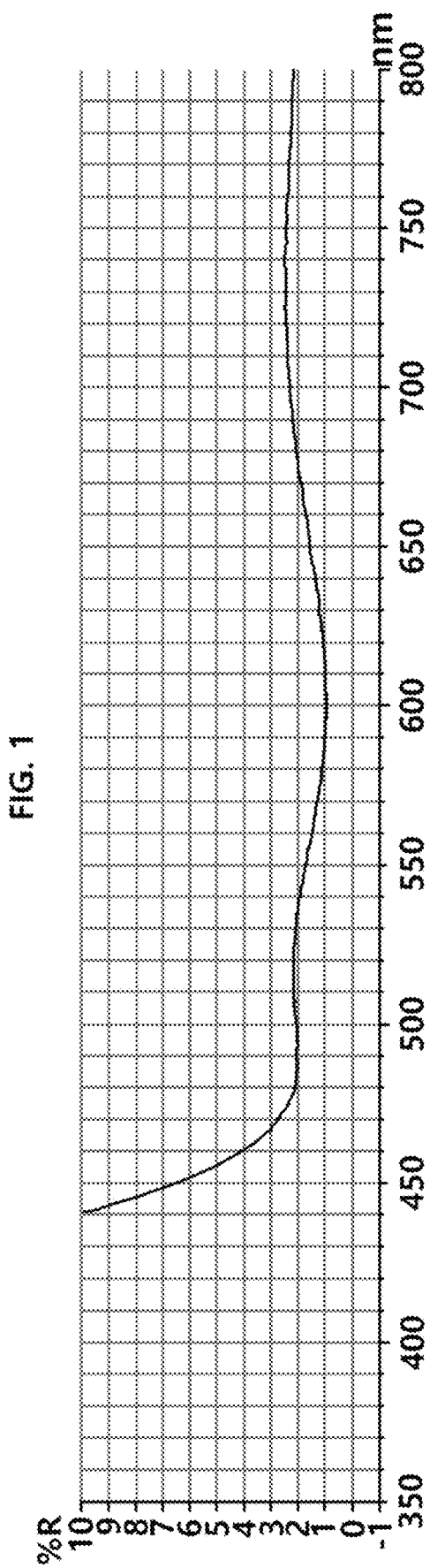
FIG. 1 is a graph of reflectance measured for an electromagnetic wave in a wavelength range including a visible light wavelength range for a laminate of Example 1 of the present disclosure.

Hereinafter, the present disclosure will be described in more detail to help understand the present disclosure.

Terms or words used in the present specification and claims should not be construed as being limited to conventional or dictionary meanings, but should be interpreted as a meaning and a concept consistent with the technical idea of the present disclosure based on the principle that the inventor may appropriately define the concept of the term to describe invention thereof in the best way.

The present disclosure provides a laminate. The laminate may include a coating layer and a water-repellent layer for protecting a surface of a cover glass of an optical lens. As a specific example, the laminate may include a coating layer and a water-repellent layer for protecting a surface of a cover glass of a camera lens used in a vehicle.

According to one embodiment of the present disclosure, in the laminate, a substrate, the coating layer, and the water-repellent layer may be sequentially laminated. The coating layer may be composed of a first coating layer and a second coating layer alternately laminated one or more times. The first coating layer may contain at least one metal oxide selected from a group consisting of a lanthanide metal oxide, a transition metal oxide, and a composite metal oxide containing lanthanum metal and transition metal, and the second coating layer may contain an alkaline earth metal fluoride and the transition metal oxide.

According to one embodiment of the present disclosure, the substrate may be the cover glass. As a specific example, the substrate may be the cover glass of the optical lens. As a more specific example, the substrate may be the cover glass of the camera lens used in the vehicle. In this connection, the cover glass may be a glass usable for the optical lens.

According to one embodiment of the present disclosure, the coating layer may be for imparting chemical resistance and low reflectivity to the laminate. As a specific example, in the coating layer, the first coating layer and the second coating layer may be alternately laminated one or more times. In this connection, in relation to that the first coating layer and the second coating layer are alternately laminated one or more times, the first coating layer and the second coating layer being alternately laminated once means that the first coating layer and the second coating layer are sequentially laminated as in 'the first coating layer/the second coating layer.' The first coating layer and the second coating layer being alternately laminated twice means that the first coating layer and the second coating layer are sequentially laminated twice in a repeated manner as in 'the first coating layer/the second coating layer/the first coating layer/the second coating layer'. The first coating layer and the second coating layer being alternately laminated 3 times means that the first coating layer and the second coating layer are sequentially laminated three times in the repeated manner as in 'the first coating layer/the second coating layer/the first coating layer/the second coating layer/the first coating layer/the second coating layer'. That is, the first coating layer and the second coating layer being alternately laminated n times means that the first coating layer and the second coating layer are sequentially laminated n times in the repeated manner (here, n means a natural number equal to or greater than 1). In one example, as will be described below, when the first and second coating layers are alternately laminated two or more times, depending on the number of repetitions of the alternate laminating of the first coating layer and the second coating layer, the first coating layer may be represented as 'a first coating layer of a first pair of the first and second coating layers,' 'a first coating layer of a second pair of the first and second coating layers,' 'a first coating layer of a third pair of the first and second coating layers,' etc., and the second coating layer may be represented as 'a second coating layer of a first pair of the first and second coating layers,' 'a second coating layer of a second pair of the first and second coating layers,' 'a second coating layer of a third pair of the first and second coating layers,' etc. for distinguishment of the first coating layer and the second coating layer that are repeatedly laminated.

According to one embodiment of the present disclosure, the first coating layer may contain at least one metal oxide selected from the group consisting of the lanthanide metal oxide, the transition metal oxide, and the composite metal oxide containing the lanthanum metal and the transition metal. In this case, by a difference in refractive index with the second coating layer, it is possible to simultaneously secure the low reflectivity and imparting the chemical resistance from the coating layer including the first coating layer and the second coating layer.

According to one embodiment of the present disclosure, the first coating layer may contain at least one metal oxide selected from a group consisting of the lanthanide metal oxide, a Group IV transition metal oxide, and a composite metal oxide containing the lanthanide metal and Group IV transition metal. As a specific example, the first coating layer may contain at least one metal oxide selected from a group consisting of a lanthanum oxide, a titanium oxide, and a lanthanum titanium oxide. That is, the lanthanide metal oxide that may be contained in the first coating layer may be a lanthanum oxide ($La_2O_3$), the transition metal oxide may be the Group IV transition metal oxide, and may be a titanium oxide ($TiO_2$) as a specific example, and the composite metal oxide containing the lanthanide metal and the transition metal may be a composite metal oxide containing the lanthanide metal and the Group IV transition metal, and may be a lanthanum titanium oxide ($LaTiO_3$) as a specific example.

According to one embodiment of the present disclosure, the first coating layer may contain the composite metal oxide containing the lanthanide metal and the transition metal as a main component. In this connection, the composite metal oxide may be formed from a mixture of the lanthanide metal oxide and the transition metal oxide. Accordingly, the first coating layer may contain the lanthanide metal oxide and the transition metal oxide, which are precursors of the composite metal oxide, as sub-components in addition to the composite metal oxide.

According to one embodiment of the present disclosure, the second coating layer may contain the alkaline earth metal fluoride and the transition metal oxide. In this case, by the difference in the refractive index with the first coating layer, it is possible to simultaneously secure the low reflectivity and impart the chemical resistance from the coating layer including the first coating layer and the second coating layer.

According to one embodiment of the present disclosure, the second coating layer may contain about 85 wt % to about 95 wt % of the alkaline earth metal fluoride and about 5 wt % to about 15 wt % of the transition metal oxide. Within such range, it is possible to particularly improve chemical resistance to a cleaning agent, especially acid ammonium fluoride.

According to one embodiment of the present disclosure, the second coating layer may contain the alkaline earth metal fluoride and a Group III transition metal oxide. As a specific example, the second coating layer may contain a magnesium fluoride and an yttrium oxide. That is, the alkaline earth metal fluoride that may be contained in the second coating layer may be a magnesium fluoride ($MgF_2$), and the transition metal oxide may be the Group III transition metal oxide, and may be an yttrium oxide ($Y_2O_3$) as a specific example.

According to one embodiment of the present disclosure, the alkaline earth metal fluoride may have an oxygen content equal to or lower than about 0.06 wt %. As a specific example, the magnesium fluoride may have an oxygen content equal to or lower than about 0.06 wt % or lower than about 0.06 wt %. Within such range, it is possible to particularly improve the chemical resistance to the cleaning agent, especially the acid ammonium fluoride.

According to one embodiment of the present disclosure, an outermost portion of the first coating layer of the coating layer may be formed on a surface of the substrate, and the water-repellent layer may be formed on a surface of an outermost portion of the second coating layer of the coating layer. The outermost portion of the first coating layer may mean the first coating layer when the first coating layer and the second coating layer are alternately laminated once in the coating layer. When the first coating layer and the second coating layer are alternately laminated n times in the coating layer, the outermost portion of the first coating layer may mean a first coating layer located at an outermost portion of a coating layer laminate structure. In addition, the outermost portion of the second coating layer may mean the second coating layer when the first coating layer and the second coating layer are alternately laminated once in the coating layer. When the first coating layer and the second coating layer are alternately laminated n times in the coating layer, the outermost portion of the second coating layer may mean a second coating layer located at the outermost portion of the coating layer laminate structure. That is, the laminate may have a laminate structure of 'the substrate/the first coating layer/the second coating layer/the water-repellent layer' when the first coating layer and the second coating layer are alternately laminated once. When the first coating layer and the second coating layer are alternately laminated twice, the laminate may have a laminate structure of 'the substrate/the first coating layer/the second coating layer/the first coating layer/the second coating layer/the water-repellent layer.' When the first coating layer and the second coating layer are alternately laminated three times, the laminate may have a laminate structure of 'the substrate/the first coating layer/the second coating layer/the first coating layer/the second coating layer/the first coating layer/the second coating layer/the water-repellent layer'. As such, the first coating layer and the second coating layer being alternately laminated n times in the laminate may mean that the first coating layer and the second coating layer are sequentially laminated n times in the repeated manner between the substrate and the water-repellent layer (here, n means the natural number equal to or greater than 1).

According to one embodiment of the present disclosure, in the coating layer, the first coating layer and the second coating layer may be alternately laminated one or more times, 1 to 5 times, 2 to 4 times, or 3 times. Within such range, it is possible to simultaneously secure the low reflectivity and the chemical resistance while maintaining an appropriate level of laminate thickness.

According to one embodiment of the present disclosure, when the first coating layer and the second coating layer are alternately laminated three times in the coating layer in order to produce a first pair of the first and second coating layers, a second pair of the first and second coating layer laminated on the first pair, and a third pair of the first and second coating layers laminated on the second pair. In this connection, each first coating layer of the first, second and third pairs may contain the same component as the first coating layer described above, but have a different laminate order. Each of the second coating layer of the first, second and third pairs may contain the same component as the second coating layer described above, but have a different laminate order. As another example, each first coating layer of the first, second and third pairs may contain the same component as the first coating layer described above, but have the different laminate order and a different thickness. Each second coating layer of the first, second and third pairs may contain the same component as the second coating layer described above, but have the different laminate order and a different thickness.

According to one embodiment of the present disclosure, a thickness of the first coating layer of the first pair may be about 1 nm to about 30 nm, about 5 nm to about 20 nm, or about 10 nm to about 15 nm, a thickness of the second coating layer of the first pair may be about 30 nm to about 80 nm, about 40 nm to about 70 nm, or about 50 nm to about 60 nm, a thickness of the first coating layer of the second pair is about 30 nm to about 80 nm, about 40 nm to about 70 nm, or about 50 nm to about 60 nm, a thickness of the second coating layer of the second pair may be about 20 nm to about 60 nm, about 30 nm to about 50 nm, or about 40 nm to about 45 nm, a thickness of the first coating layer of the third pair may be about 150 nm to about 300 nm, about 170 nm to about 250 nm, or about 180 nm to about 210 nm, and a thickness of the second coating layer of the third pair may be about 100 nm to about 200 nm, about 100 nm to about 150 nm, or about 120 nm to about 140 nm. Within such range, while the low reflectivity is particularly good, the chemical resistance is excellent.

According to one embodiment of the present disclosure, a total thickness of the coating layer may be 300 nm to 700 nm, 400 nm to 600 nm, or 450 nm to 550 nm. Within such range, it is possible to secure productivity by preventing a cost increase resulted from an increase in an amount of coating, and at the same time, it is possible to secure the low reflectivity and the chemical resistance.

According to one embodiment of the present disclosure, the water-repellent layer may contain a silane-based fluorine compound. The silane-based fluorine compound may be a siloxane compound combined with a fluorine compound, and may be the siloxane compound combined with polytetrafluoroethylene as a specific example. In this case, the water repellency is excellent.

According to one embodiment of the present disclosure, the water-repellent layer may be formed from the silane-based fluorine compound. As a specific example, the water-repellent layer may contain polysiloxane in a form in which the siloxane compounds combined with the fluorine compound are polymerized with each other.

According to one embodiment of the present disclosure, a thickness of the water-repellent layer may be 10 nm to 200 nm, 20 nm to 150 nm, 30 nm to 100 nm, 40 nm to 70 nm, or 40 nm to 60 nm. Within such range, it is possible to secure the excellent water repellency without deteriorating the low reflectivity and the chemical resistance by the coating layer.

According to one embodiment of the present disclosure, a total thickness of the coating layer and the water-repellent layer excluding the substrate may be 300 nm to 900 nm, 400 nm to 700 nm, or 500 nm to 600 nm. Within such range, all of the low reflectivity, the chemical resistance, and the water repellency of the laminate are excellent.

According to one embodiment of the present disclosure, the laminate may have a reflectance equal to or lower than 8% measured for an electromagnetic wave in a wavelength range of visible light. As a specific example, the laminate may have a reflectance equal to or lower than 8%, 1% to 8%, 3% to 8%, or 5% to 8%, measured for an electromagnetic wave in a wavelength range from 420 nm to 620 nm. Within such range, the low reflectivity is excellent.

According to one embodiment of the present disclosure, the laminate may have a contact angle between a surface of the water-repellent layer and a droplet dropped on the surface of the water-repellent layer of equal to or greater than 90°, equal to or greater than 95°, equal to or greater than 100°, or 100° to 120°. Within such range, the water repellency is excellent.

In addition, the present disclosure provides a laminate preparing method for preparing the laminate.

According to one embodiment of the present disclosure, the laminate preparing method may include an operation (S10) of preparing the substrate, an operation (S20) of laminating the coating layer on one surface of the substrate, and an operation (S30) of laminating the water-repellent layer on the surface of the coating layer. The operation (S20) may include an operation of alternately laminating the first coating layer and the second coating layer one or more times. The first coating layer may contain at least one selected from the group consisting of the lanthanide metal oxide, the transition metal oxide, and the composite metal oxide containing the lanthanide metal and the transition metal, and the second coating layer may contain the alkaline earth metal fluoride and the transition metal oxide.

According to one embodiment of the present disclosure, the operation (S10), which is the operation of preparing the substrate, may be an operation of preparing the cover glass that may be used as the substrate. The cover glass may be prepared as the cover glass alone or as the cover glass attached to the optical lens.

According to one embodiment of the present disclosure, the operation (S20), which is the operation for forming the coating layer on one surface of the substrate, may be performed including the operation of alternately laminating the first coating layer and the second coating layer one or more times, and may be performed including an operation (S21) of forming the first coating layer on one surface of the substrate and an operation (S22) of forming the second coating layer on a surface of the first coating layer as a specific example.

According to one embodiment of the present disclosure, when the operation (S20) is performed including an operation of alternately laminating the first coating layer and the second coating layer twice, the operation (S20) may be performed including the operation (S21) of forming the first coating layer on one surface of the substrate, the operation (S22) of forming the second coating layer on the surface of the first coating layer, an operation (S23) of forming the first coating layer on a surface of the second coating layer, and an operation (S24) of forming the second coating layer on the surface of the first coating layer. In addition, when the operation (S20) is performed including an operation of alternately laminating the first coating layer and the second coating layer three or more times, the operation (S20) may be performed including the operation (S21) of forming the first coating layer on one surface of the substrate, the operation (S22) of forming the second coating layer on the surface of the first coating layer, the operation (S23) of forming the first coating layer on the surface of the second coating layer, and the operation (S24) of forming the second coating layer on the surface of the first coating layer. In this connection, the operations (S23) and (S24) may be repeatedly performed depending on the number of repetitions of the alternate laminating of the first coating layer and the second coating layer.

According to one embodiment of the present disclosure, the first coating layer and the second coating layer may be laminated using a chemical vapor deposition (CVD), physical vapor deposition (PVD), atomic layer deposition (ALD), ion-assisted deposition (IAD) method, and may be laminated using the ion-assisted deposition method from a viewpoint of uniformity of the laminating and ease of adjusting a laminating thickness based on the components of the first coating layer and the second coating layer.

According to one embodiment of the present disclosure, components of each of the first coating layer and the second coating layer of the laminate preparing method may be the same as the components of each of the first coating layer and the second coating layer described in the above laminate.

According to one embodiment of the present disclosure, the operation (S30), which is the operation of laminating the water-repellent layer on the surface of the coating layer, may be performed after the laminating of the coating layer is completed. In this connection, the surface of the coating layer may be the surface of the outermost portion of the second coating layer.

According to one embodiment of the present disclosure, when laminating the water-repellent layer, to improve adhesiveness of the water-repellent layer to the surface of the coating layer, the operation (S30) may be performed including an operation of performing ion etching on the surface of the outermost portion of the second coating layer of the coating layer, and an operation of laminating the water-repellent layer on the surface of the outermost portion of the second coating layer of the coating layer whose surface is ion-etched. When performing the ion etching on the surface of the outermost portion of the second coating layer of the coating layer as described above, a surface roughness occurs on the surface or the surface is ionized, so that the adhesiveness is improved as a physical bonding strength is increased when the water-repellent layer is laminated on the surface of the coating layer.

Hereinafter, Example of the present disclosure will be described in detail such that a person having ordinary knowledge in the technical field to which the present disclosure belongs may easily implement the present disclosure. However, the present disclosure may be embodied in several different forms and may not be limited to the Example described herein.

EXAMPLE

Example 1

The cover glass used for the vehicle camera lens was prepared. On the surface of the cover glass, the lanthanum titanium oxide (DON, product name: SV-7) and a mixture (DON, product name: SV-65) of the magnesium fluoride and the yttrium oxide were alternately laminated in the repeated manner three times using the ion-assisted deposition method. Thereafter, after performing the ion etching process on a surface of an outermost portion of the layer on which the mixture of the magnesium fluoride and the yttrium oxide is laminated, the silane-based fluorine compound (manufacturer CEKO, product name: Top CleanSafe™ TC) was laminated. A laminate composition and a thickness of each layer are shown in Table 1 below.

TABLE 1

| Division | Laminate composition | Thickness (nm) |
|---|---|---|
| Substrate | Cover glass | — |
| First coating layer of first pair | Lanthanum titanium oxide | 13 |
| Second coating layer of first pair | Mixture of magnesium fluoride and yttrium oxide | 56.8 |
| First coating layer of second pair | Lanthanum titanium oxide | 54.4 |
| Second coating layer of second pair | Mixture of magnesium fluoride and yttrium oxide | 41.8 |
| First coating layer of third pair | Lanthanum titanium oxide | 194.7 |
| Second coating layer of third pair | Mixture of magnesium fluoride and yttrium oxide | 127.4 |
| Water-repellent layer | Silane-based fluorine compound | 50.0 |
| Laminate | | 538.1 |

Comparative Example 1

The cover glass used for the vehicle camera lens was prepared. An aluminum oxide ($Al_2O_3$) and the magnesium fluoride were sequentially laminated on the surface of the cover glass using the ion-assisted deposition method. A laminate composition and a thickness of each layer are shown in Table 2 below.

TABLE 2

| Division | Laminate composition | Thickness (nm) |
|---|---|---|
| Substrate | Cover glass | — |
| First coating layer | Aluminum oxide | 20 |
| Second coating layer | Magnesium fluoride | 100 |
| Laminate | | 120 |

Comparative Example 2

The cover glass used for the vehicle camera lens was prepared. An aluminum tantalum oxide (Merck, product name: M5) was laminated on the surface of the cover glass using the ion-assisted deposition method. Then, on a surface of the aluminum tantalum oxide layer, the lanthanum titanium oxide (Merck, product name: H4) and the aluminum oxide (Eurama, product name: EU-3) were alternately laminated in the repeated manner three times using the ion-assisted deposition. Thereafter, after performing the ion etching process on a surface of an outermost portion of the layer on which the aluminum oxide is laminated, the silane-based fluorine compound (manufacturer CEKO, product name: Top CleanSafe™ TC) was laminated. A laminate composition and a thickness of each layer are shown in Table 3 below.

TABLE 3

| Division | Laminate composition | Thickness (nm) |
|---|---|---|
| Substrate | Cover glass | — |
| Basic coating layer | Aluminum tantalum oxide | 20.0 |
| First coating layer of first pair | Lanthanum titanium oxide | 12.5 |
| Second coating layer of first pair | Aluminum oxide | 42.2 |
| First coating layer of second pair | Lanthanum titanium oxide | 37.7 |
| Second coating layer of second pair | Aluminum oxide | 32.7 |
| First coating layer of third pair | Lanthanum titanium oxide | 158.2 |
| Second coating layer of third pair | Aluminum oxide | 98.9 |
| Water-repellent layer | Silane-based fluorine compound | 50.0 |
| Laminate | | 452.2 |

EXPERIMENTAL EXAMPLE

Experimental Example 1

Figure 2:
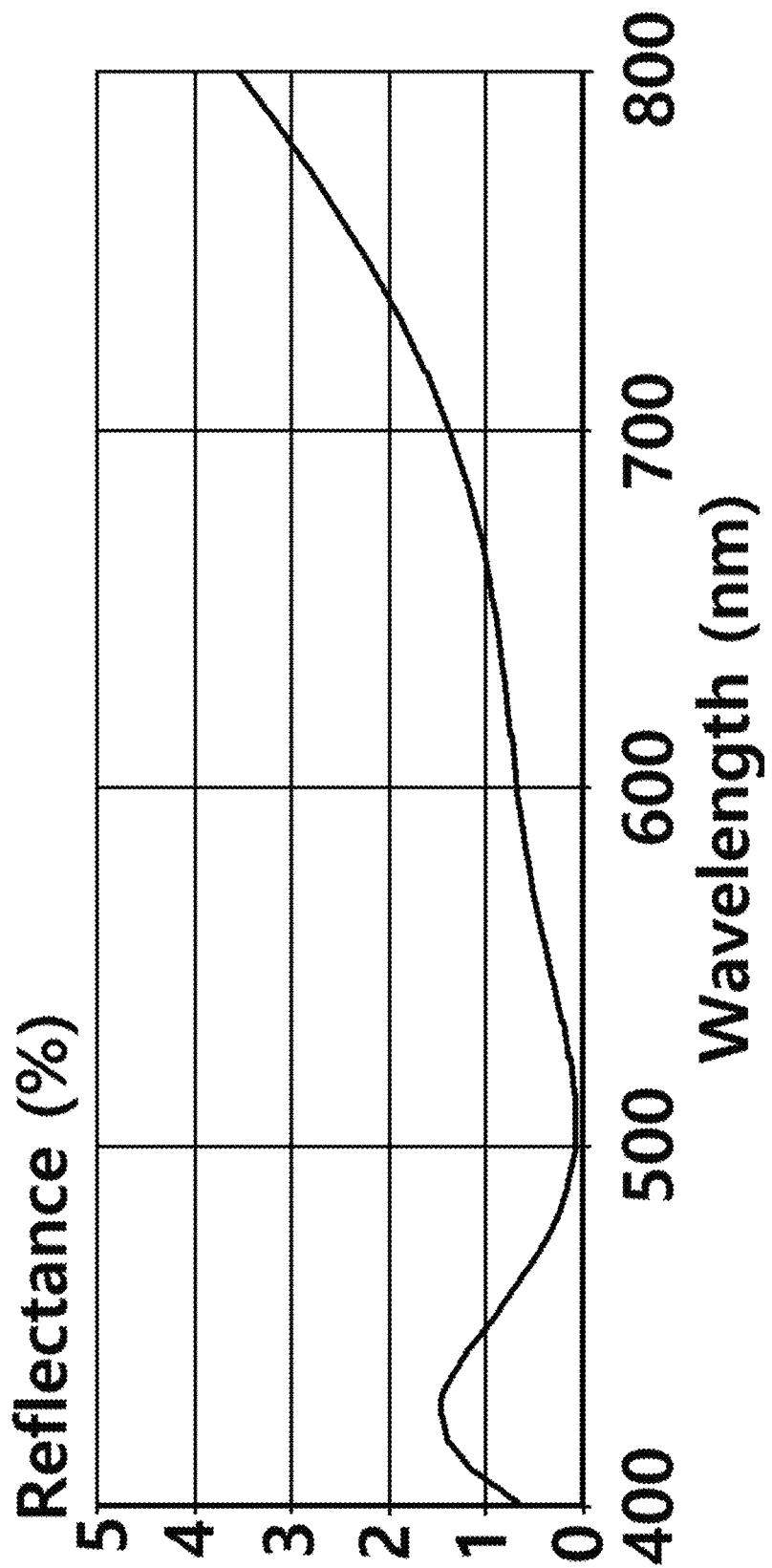
FIG. 2 is a graph of reflectance measured for an electromagnetic wave in a wavelength range including a visible light wavelength range for a laminate of Comparative Example 1 of the present disclosure.
Figure 3:
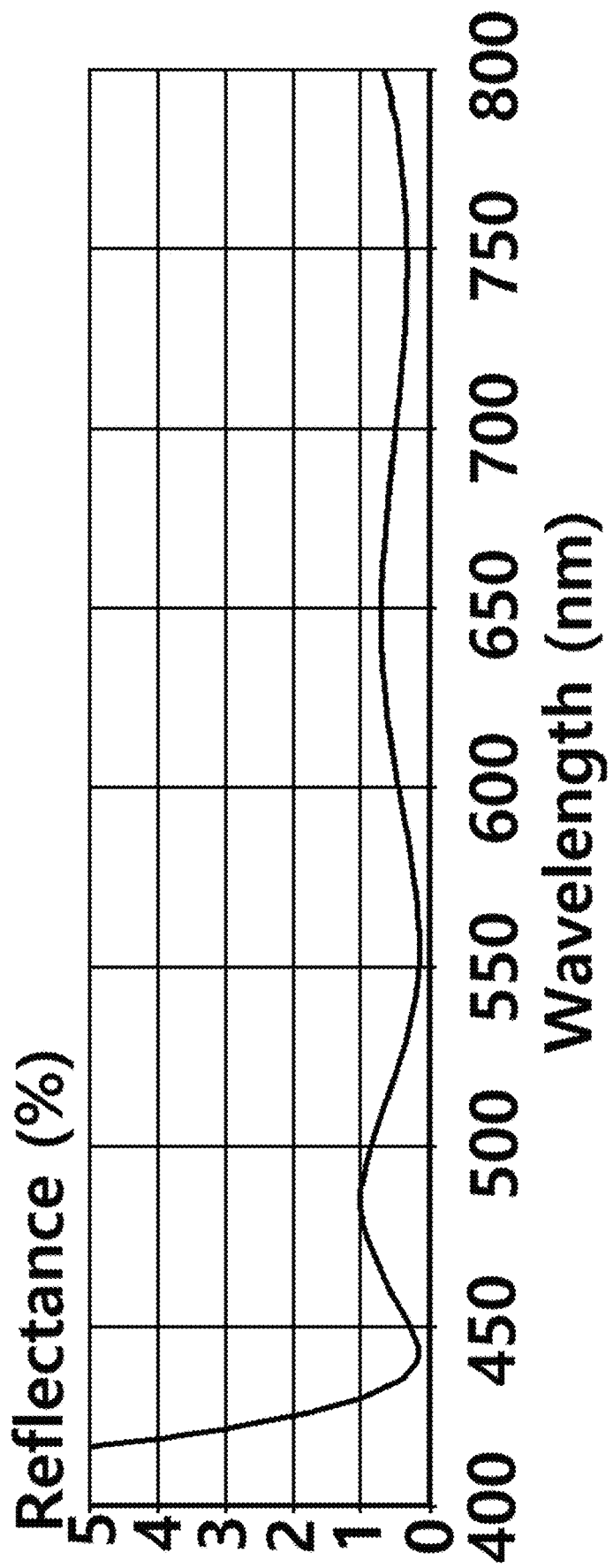
FIG. 3 is a graph of reflectance measured for an electromagnetic wave in a wavelength range including a visible light wavelength range for a laminate of Comparative Example 2 of the present disclosure.

With respect to the laminates prepared in Example 1, Comparative Examples 1 and 2, reflectances for the electromagnetic wave in the wavelength range including the visible light wavelength range were measured and shown in FIGS. 1 to 3, respectively.

As shown in FIGS. 1 to 3, it was identified that reflectances measured for the electromagnetic wave in the wavelength range from 420 nm to 620 nm were maintained at a low level in the laminates of Example 1 (FIG. 1) and Comparative Example 2 (FIG. 3), but it was identified that, because there is a large change in the reflectance, it is difficult to uniformly secure low reflectance in an electromagnetic wave in a wide wavelength range in the laminate of Comparative Example 1 (FIG. 2).

Experimental Example 2

Except for Comparative Example 1 with the substantial change in the reflectance in Experimental Example 1, for the laminates of Example 1 and Comparative Example 2 that implement the low reflectivity, about 0.5 weight percent (wt %) aqueous solution and about 2.0 wt % aqueous solution of the acid ammonium fluoride were applied dropwise on the surface of the water-repellent layer for 5 minutes, and then whether the coating layer is damages was visually inspected. The inspection result is shown in FIG. 4.

As shown in FIG. 4, although it was identified that the laminate of Example 1 according to the present disclosure is imparted with the chemical resistance as the coating layer was maintained without the damage even when being exposed to about 0.5 wt % aqueous solution and about 2.0 wt % aqueous solution of the acid ammonium fluoride for about 5 minutes, it was identified that, when the laminate of Comparative Example 2 was exposed to about 0.5 wt % aqueous solution and about 2.0 wt % aqueous solution of the acid ammonium fluoride for about 5 minutes, the coating layer was not maintained as the damage occurred on the surface.

Experimental Example 3

Except for Comparative Example 2, which does not show the chemical resistance in Experimental Example 2, for the laminate of Example 1 that implements the low reflectivity and the chemical resistance, distilled water was dropped on the surface of the water-repellent layer, and the contact angle between the surface of the water-repellent layer and the droplet dropped on the surface of the water-repellent layer was measured using SEO's PHEONIX 300 TOUCH. The measurement result is shown in FIG. 5.

As shown in FIG. 5, it was identified that the laminate of Example 1 according to the present disclosure has the excellent water repellency as the contact angle between the surface of the water-repellent layer and the droplet dropped on the surface of the water-repellent layer was 110°.

Experimental Example 4

As identified in Experimental Example 3 above, for the laminate of Example 1 that simultaneously implements the low reflectivity, the chemical resistance, and the water repellency, a tape peel test was performed in accordance with ISO 2409 (Paints and varnishes—Cross-cut test). Specifically, the surface of the laminate of Example 1 was cleaned with a soft brush, and was subjected to cross-cut with a knife in an 'X' shape such that a center of a circle on a surface of a circular lens is passed through. Thereafter, after firmly attaching a tape (KS T 1058 (cellophane adhesive tapes), JIS Z 1522 (Pressure sensitive adhesive cellophane tapes)) to the lens surface, one end of the tape was removed by being pulled strongly at an angle perpendicular to a direction in which the lens is placed. An adhesiveness grade identified based on following criteria was a 5A grade. From such result, it was identified that the laminate of Example 1 of the present disclosure has excellent adhesiveness.
- 5A: No peeling should occur
- 4A: Fine peeling should occur near an intersection
- 3A: Peeling equal to or smaller than 1.6 mm should occur on both cross lines
- 2A: Peeling equal to or smaller than 3.2 mm should occur on both cross lines
- 1A: Peeling should occur in most of a region X
- 0A: Complete peeling of the region X should occur Experimental Example 5

As identified in Experimental Example 4, for the laminate of Example 1 that simultaneously implements the low reflectivity, the chemical resistance, the water repellency, and the adhesiveness, after exposure to each environment in following methods, the reflectance, the contact angle, and the adhesiveness measured for the electromagnetic wave in the wavelength range from 420 nm to 620 nm were evaluated and shown in Table 4 below.
- Wear resistance: The laminate of Example 1 was put on wear resistance measure equipment equipped with a sample stand and a friction member (friction material: double-sided canvas #10 (KS K 1450, JIS L 0803), width: 20 mm×20 mm) capable of reciprocating in a transverse direction on a surface of the sample stand. Then, the friction member was reciprocated 1,500 times at a load of 4.9 N, a reciprocating friction stroke of 100±5 mm, and a reciprocating friction speed of 20 times/min.
- Moisture resistance: The laminate of Example 1 was exposed at 50° C. and 95% relative humidity for 240 hours.
- Water resistance: The laminate of Example 1 was exposed at 40° C. for 240 hours.
- Heat resistance: The laminate of Example 1 was exposed at 85° C. for 168 hours.
- 85/85 test: The laminate of Example 1 was exposed at 85° C. and 85% relative humidity for 168 hours.
- Heat cycle resistance: The laminate of Example 1 was sequentially and repeatedly exposed to following operations (S100), (S200), and (S300) 5 times.
  - (S100) After 3 hours at 80±2° C., 1 hour at a room temperature
  - (S200) After 3 hours at −40±2° C., 1 hour at the room temperature
  - (S300) After 7 hours at 50±2° C. and 95±2% relative humidity, 1 hour at the room temperature
- Thermal shock cyclability: The laminate of Example 1 was sequentially and repeatedly exposed at 40° C. for 30 minutes and then at 85° C. for 30 minutes 1,000 times.
- Salt spray resistance: The laminate of Example 1 was exposed to salt water at a concentration of 5 wt % for 168 hours.
- Chemical resistance: Gasoline was applied to the laminate of Example 1.
- Acid resistance: After applying 1 N aqueous sulfuric acid solution to the laminate of Example 1, the laminate of Example 1 was exposed to the aqueous sulfuric acid solution for 2 hours.
- Basic resistance: After applying 1 N aqueous sodium hydroxide solution to the laminate of Example 1, the laminate of Example 1 was exposed to the aqueous sodium hydroxide solution for 2 hours.
- Accelerated weathering resistance: For the laminate of Example 1, an accelerated weathering resistance test was performed under an invisible region condition (1,250 kJ/m$^2$ [340 nm]) using a WEATHER-O-ME-TER. Specifically, at a Black Panel temperature of 70±2° C. (Light) and 38±2° C. (Dark), under a cycle condition of 40 minutes irradiation at 50±5% relative humidity, 20 minutes irradiation of surface spray, 60 minutes irradiation at 50±5% relative humidity, and 60 minutes non-irradiation of surface and back spray at 95±5% relative humidity, continuous irradiation was performed with an irradiance of 0.55±0.22 W/(m$^2$·nm) [340 nm] with a combination of Quartz as an inner filter and "TYPE S" borosilicate as an outer filter.

TABLE 4

| | Example 1 | | |
| --- | --- | --- | --- |
| Division | Reflectance (%) measured for electromagnetic wave in wavelength range from 420 nm to 620 nm | Contact angle (°) | Adhesiveness |
| Before exposure | 5.7 | 110 | 5A |
| Wear resistance | 5.9 | 109 | 5A |
| Moisture resistance | 7.3 | 110 | 5A |
| Water resistance | 5.4 | 105 | 5A |
| Heat resistance | 6.0 | 108 | 5A |
| 85/85 test | 7.2 | 107 | 5A |
| Heat cycle resistance | 7.1 | 110 | 5A |
| Thermal shock cyclability | 6.3 | 101 | 5A |
| Salt spray resistance | 6.7 | 105 | 5A |
| Chemical resistance | 5.6 | 104 | 5A |
| Acid resistance | 5.5 | 104 | 5A |
| Basic resistance | 5.7 | 108 | 5A |
| Accelerated weathering resistance | 7.0 | 103 | 5A |

As shown in Table 4 above, it was identified that, even when the laminate of Example 1 according to the present disclosure was exposed to the various environments, as the same level of reflectance, contact angle, and adhesion were maintained, durability is excellent.

From such result, it was identified that, as the laminate according to the present disclosure includes both the coating layer and the water-repellent layer laminated on the substrate, it is possible to secure the chemical resistance and the low reflectivity from the coating layer, secure the water repellency from the water-repellent layer, and the durability for the chemical resistance, the low reflectivity, and the water repellency is excellent even when the laminate is exposed to the various environments.

The laminate according to the present disclosure includes both the coating layer and the water-repellent layer laminated on the substrate, thereby securing the chemical resistance and the low reflectivity from the coating layer, and securing the water repellency from the water-repellent layer.

In addition, the laminate according to the present disclosure has the excellent durability for the chemical resistance, the low reflectivity, and the water repellency even when being exposed to the various environments.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A laminate comprising:
a substrate;
a plurality of coating layers laminated on the substrate and comprising first and second coating layers laminated alternately; and
a water-repellent layer laminated on the plurality of coating layers,
wherein the first coating layer comprises at least one metal oxide selected from a group consisting of a lanthanide metal oxide, a first transition metal oxide, and a composite metal oxide comprising lanthanum metal and transition metal, and
wherein the second coating layer comprises about 85 weight percent (wt %) to about 95 wt % of an alkaline earth metal fluoride and about 5 wt % to about 15 wt % of a second transition metal oxide.

2. The laminated of claim 1, wherein, in the first coating layer, the transition metal comprises Group IV transition metal.

3. The laminated of claim 1, wherein, in the first coating layer, the lanthanide metal oxide comprises a lanthanum oxide, the first transition metal oxide comprises a titanium oxide, and the composite metal oxide comprises a lanthanum titanium oxide.

4. The laminated of claim 1, wherein, in the second coating layer, the second transition metal oxide comprises a Group DI transition metal oxide.

5. The laminated of claim 1, wherein, in the second coating layer, the alkaline earth metal fluoride comprises a magnesium fluoride, and the second transition metal oxide comprises an yttrium oxide.

6. The laminated of claim 1, wherein, in the second coating layer, the alkaline earth metal fluoride has an oxygen content of about 0.06 wt % or less.

7. The laminated of claim 1, wherein:
an outermost portion of the first coating layer is positioned on a surface of the substrate,
the water-repellent layer is positioned on a surface of an outermost portion of the second coating layer.

8. The laminated of claim 1, wherein, in the plurality of coating layers, the first and second coating layers are alternately laminated one to five times.

9. The laminated of claim 1, wherein the plurality of coating layers comprise a first pair of the first and second coating layers, a second pair of the first and second coating layers laminated on the first pair, and a third pair of the first and second coating layers laminated on the second pair.

10. The laminated of claim 9, wherein:
a thickness of the first coating layer of the first pair is about 1 nm to about 30 nm,
a thickness of the second coating layer of the first pair is about 30 nm to about 80 nm,
a thickness of the first coating layer of the second pair is about 30 nm to about 80 nm,
a thickness of the second coating layer of the second pair is about 20 nm to about 60 nm,
a thickness of the first coating layer of the third pair is about 150 nm to about 300 nm, and
a thickness of the second coating layer of the third pair is about 100 nm to about 200 nm.

11. The laminated of claim 1, wherein water-repellent layer further comprises a silane-based fluorine compound.

12. A method for producing a laminate, comprising:
laminating a plurality of coating layers on a substrate; and
laminating a water-repellent layer on the plurality of coating layers,
wherein laminating the plurality of coating layers comprises laminating first and second coating layers alternately,
wherein the first coating layer comprises at least one selected from a group consisting of a lanthanide metal oxide, a first transition metal oxide, and a composite metal oxide containing lanthanide metal and transition metal, and
wherein the second coating layer comprises about 85 wt % to about 95 wt % of an alkaline earth metal fluoride and about 5 wt % to about 15 wt % of a second transition metal oxide.

13. The method of claim 12, wherein laminating the first and second coating layers comprises ion-assisted deposition.

14. The method of claim 12, wherein laminating the water-repellent layer on the plurality of coating layers comprises:
ion etching a surface of an outermost portion of the second coating layer; and
laminating the water-repellent layer on the ion-etched surface of the outermost portion of the second coating layer.

* * * * *